United States Patent
Alptekin et al.

(10) Patent No.: US 11,469,226 B2
(45) Date of Patent: Oct. 11, 2022

(54) LEAKAGE CURRENT REDUCTION IN ELECTRICAL ISOLATION GATE STRUCTURES

(71) Applicant: Apple Inc., Cupertino, CA (US)

(72) Inventors: Emre Alptekin, Santa Clara, CA (US); Thomas Hoffmann, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 286 days.

(21) Appl. No.: 16/913,770

(22) Filed: Jun. 26, 2020

(65) Prior Publication Data

US 2020/0328205 A1    Oct. 15, 2020

Related U.S. Application Data (63) Continuation of application No. 16/156,461, filed on Oct. 10, 2018, now Pat. No. 10,700,065.

(51) Int. Cl.
*H01L 27/088* (2006.01)
*H01L 27/02* (2006.01)
*G06F 30/398* (2020.01)

(52) U.S. Cl.
CPC ........ *H01L 27/0883* (2013.01); *G06F 30/398* (2020.01); *H01L 27/0207* (2013.01); *H01L 27/0886* (2013.01)

(58) Field of Classification Search
CPC .................................................. H01L 27/0883
See application file for complete search history.

(56) References Cited

U.S. PATENT DOCUMENTS

| | | | |
|---|---|---|---|
| 6,006,024 A | 12/1999 | Guruswamy et al. | |
| 6,803,278 B2 * | 10/2004 | Tran ................... | H01L 27/10873 |
| | | | 257/E21.654 |
| 9,496,268 B2 | 11/2016 | Liu et al. | |
| 9,570,442 B1 | 2/2017 | Liu et al. | |
| 9,876,013 B1 | 1/2018 | Park et al. | |
| 9,922,979 B2 * | 3/2018 | Chung ............ | H01L 21/823821 |
| 10,700,065 B2 | 6/2020 | Alptekin et al. | |
| 2003/0190779 A1 | 10/2003 | Post et al. | |
| 2012/0126336 A1 | 5/2012 | Anderson et al. | |
| 2014/0264609 A1 * | 9/2014 | Fung ...................... | H01L 27/088 |
| | | | 257/368 |
| 2017/0373090 A1 | 12/2017 | Correale, Jr. et al. | |
| 2019/0006360 A1 * | 1/2019 | Tung .................. | H01L 27/0924 |
| 2019/0220568 A1 * | 7/2019 | Ryu ................ | H01L 21/823431 |
| 2020/0006153 A1 * | 1/2020 | Lee ................. | H01L 21/823431 |

OTHER PUBLICATIONS

Dally, W. "Digital Systems Engineering" copyright 1998 (Year: 1998).

* cited by examiner

*Primary Examiner* — Grant S Withers
(74) *Attorney, Agent, or Firm* — Kowert, Hood, Munyon, Rankin & Goetzel, P.C.; Lawrence J. Merkel (57) ABSTRACT

In an embodiment, an integrated circuit includes transistors in different active regions, electrically isolated using single diffusion break isolation. The single diffusion break isolation includes a first dummy transistor that has a different threshold voltage than the transistors in either active region for which the single diffusion break is creating isolation. The first dummy transistor may have lower leakage current than transistors in either active region, creating effective isolation between the active regions and consuming relatively small amounts of power due to the lower leakage currents.

20 Claims, 4 Drawing Sheets

LEAKAGE CURRENT REDUCTION IN ELECTRICAL ISOLATION GATE STRUCTURES

This application is a continuation of U.S. patent application Ser. No. 16/156,461, filed Oct. 10, 2018 and now U.S. Pat. No. 10,700,065, which is hereby incorporated by reference in its entirety.

BACKGROUND

Technical Field

Embodiments described herein are related to reduction of leakage current in dummy isolation gates between active regions that form transistors having different threshold voltages.

Description of the Related Art

As semiconductor fabrication technologies continue to evolve, reducing the feature sizes of the elements that can be fabricated on an integrated circuit, the size of a given integrated circuit incorporating a given number of transistors continues to decrease. The cost of a given integrated circuit is generally correlated to its size: larger integrated circuits are typically more costly than smaller integrated circuits.

At a given semiconductor fabrication technology node, the size of a given integrated circuit is affected by its gate density: the number of gates that can be included in a given integrated circuit area. Gate density is adversely impacted by the amount of diffusion break isolation required between active regions in the integrated circuit. A given diffusion region can be divided into multiple active regions in which transistors are formed. Different active regions can have different properties, e.g. different active regions can have different transistor types (e.g. transistors with different threshold voltages). Isolation between such active regions is required. Typically, in current semiconductor technologies, double diffusion break or even triple diffusion break isolation is used, although double diffusion break is most common. As the number of diffusion breaks used for isolation increases, the size of the isolation region increases, decreasing the gate density because the isolation regions are not being used to form actual gates that implement functionality in the integrated circuit.

Single diffusion break isolation consumes less area than double diffusion break or triple diffusion break isolation, but has not been used because of the numerous technical challenges involved that reduce the isolation effectiveness of the single diffusion break isolation and the process complexity involved in creating physical isolation in such small spacing with acceptable device variability. Another concern is managing the effects of point touch violations in mask creation is complex, and causes impacts in the single diffusion break isolation that induces larger leakage currents in the isolation region. The larger leakage currents increase total power consumption.

SUMMARY

In an embodiment, an integrated circuit includes transistors in different active regions, electrically isolated using single diffusion break isolation. The single diffusion break isolation includes a first dummy transistor that has a different threshold voltage than the transistors in either active region for which the single diffusion break is creating isolation. The first dummy transistor may have lower leakage current than transistors in either active region, creating effective isolation between the active regions and consuming relatively small amounts of power due to the lower leakage currents.

BRIEF DESCRIPTION OF THE DRAWINGS

The following detailed description makes reference to the accompanying drawings, which are now briefly described.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean "including, but not limited to." As used herein, the terms "first," "second," etc. are used as labels for nouns that they precede, and do not imply any type of ordering (e.g., spatial, temporal, logical, etc.) unless specifically stated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

DETAILED DESCRIPTION OF EMBODIMENTS

Figure 1:
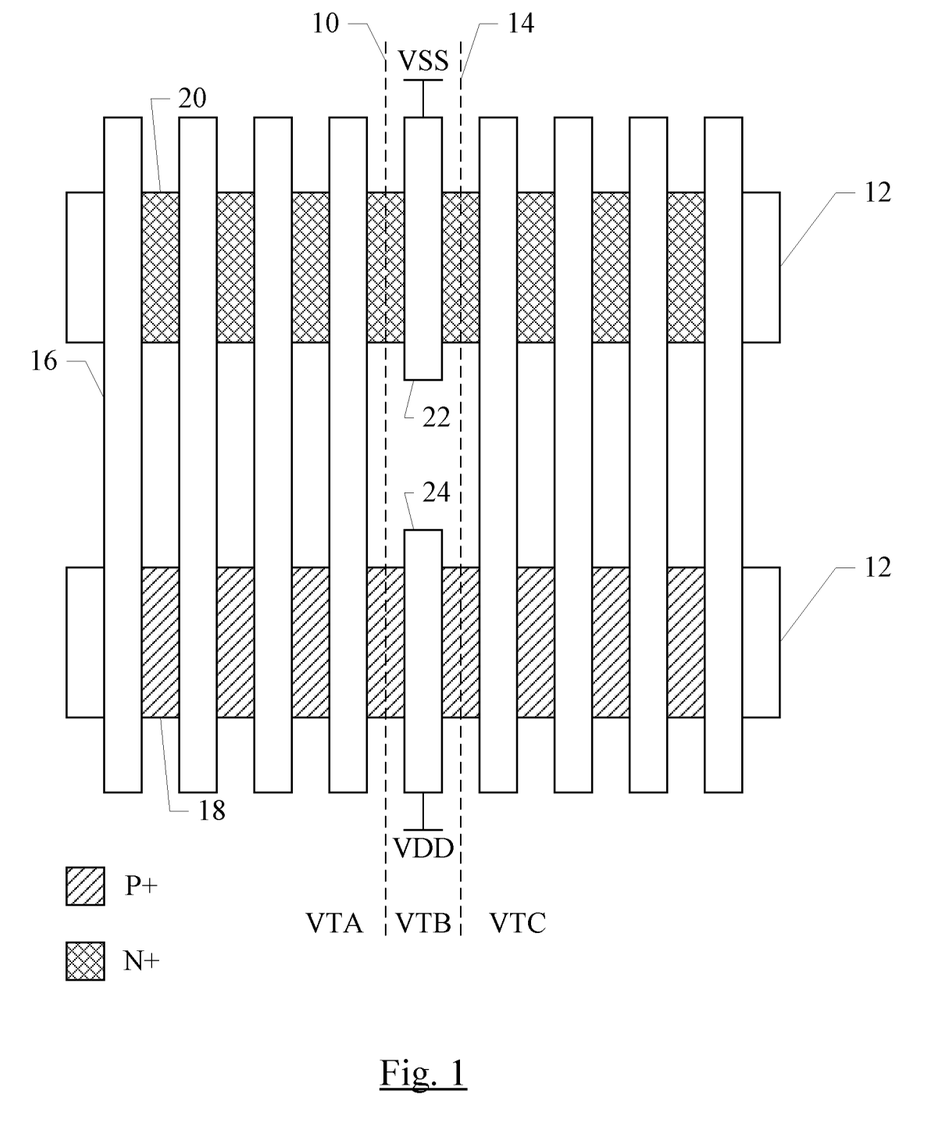
FIG. 1 is a block diagram of one embodiment of a set of transistors including transistors having different threshold voltages, separated by a single diffusion break isolation formed from a single dummy gate.

FIG. 1 is a top view of one embodiment of a portion of a semiconductor substrate with transistors formed on the substrate. In various embodiments, the substrate may have a first conductivity type (e.g. P-type (P) or N-type (N)). The conductivity type may be dependent on the impurities that are included in the substrate (e.g. through diffusion or other impurity-insertion mechanisms). That is, P diffusions use different impurities than N diffusions. The impurities are also often referred to as dopants. The initial conductivity type may be based on the impurities included in the wafer prior to the start of the semiconductor fabrication process. Generally, the conductivity type may indicate the voltage needed between the gate and source of a transistor for active current conduction to occur (for the transistor to be "on"). P transistors conduct with a negative gate to source voltage, whereas N transistors conduct with a positive gate to source voltage. When the voltage is not present, the transistor is said to be not actively conducting or "off". However, in the off state, leakage currents do occur. The leakage currents are lower in magnitude than the conduction currents, but can be a significant source of power consumption in an integrated circuit.

In an exemplary embodiment, a P semiconductor substrate may be used. In the semiconductor fabrication process, an N-well may be formed in the P substrate. Other embodiments may have an N substrate and may use a P-well, or a dual-well semiconductor fabrication process may be used. The N-well is not shown in FIG. 1 for simplicity. Semiconductor diffusion regions 12 may be formed within the N-well. The diffusion regions 12 may be insulated from each other using any fabrication technique (e.g. shallow trench isolation (STI)).

The diffusion regions 12 may be doped with impurities to produce highly doped N-type and P-type conduction regions (denoted as N+ and P+). In the illustrated embodiment, cross-hatched area 18 may represent a P+ region and double cross-hatched area 20 may represent an N+ region. The areas 18 and 20 may be the areas over which the dopants may be diffused. Transistors may be formed in the diffusion regions by constructing gate structures over the diffusion regions, on the surface of the substrate (e.g. the gate 16 shown in FIG. 1).

A transistor may have a threshold voltage. The threshold voltage of a transistor may be the gate to source voltage magnitude (positive or negative, based on conductivity type) at which a channel is fully formed in the transistor from the gate to the source, so that a saturation level of active current flow is possible. Once the threshold voltage is exceeded, the transistor is considered "on." When the gate to source voltage is between zero and the threshold voltage, the current flow varies significantly with the magnitude of the voltage. Generally, a semiconductor fabrication process may support several transistor types, where different types have different threshold voltages. Transistors having low threshold voltages are generally faster to turn on, and support high performance. However, transistors having low threshold voltages may also be subject to higher leakage currents and thus contribute to higher power consumption.

Transistors may be designed to have different threshold voltages. The threshold voltage of the transistor may be the nominal voltage for that transistor. That is, a given instance of a transistor having a given threshold voltage may have variance in the actual threshold voltage that causes conduction (e.g. due to variations that occur in the semiconductor fabrication process across the integrated circuit). Other factors such as temperature, aging effects, etc. may affect the actual threshold voltage as well. However, the threshold voltage may be approximately the nominal voltage. A transistor (or transistor type) may be referred to as "having" a particular threshold voltage. This terminology refers to the nominal threshold voltage that the transistor is designed for, even though there may be some variation.

In one embodiment, the threshold voltage of a transistor may be primarily controlled based on the materials used in the gate structure that forms the transistor in a given diffusion region. The gate structure may be formed, for example, in multiple semiconductor manufacturing process steps in which layers of various materials may be applied to produce a gate "stack" on the surface of the semiconductor substrate. The materials included in the gate stack for a given transistor type, and/or the order of those materials, may control the threshold voltage of the transistor. Viewed in another way, the threshold voltage may be dependent on the materials that are used to form the gate structure. Viewed in still another way, the materials used in the gate structure may be a factor in determining the threshold voltage of the transistor, and more particularly may be a primary factor or dominant factor.

Because the lowest threshold voltage transistors are also often associated with higher leakage currents, integrated circuit designers may implement designs using multiple transistor types. Low threshold voltage transistors may be used in performance-critical areas to achieve the highest speeds, and higher threshold voltage transistors may be used where a slower performing transistor still meets design requirements. Additionally, varying transistor types may be selected based on design robustness considerations, etc.

When transistors having different threshold voltages are formed in nearby areas (e.g. adjacent standard cells), the transistors may be formed in the same diffusion region. Transistors having a given threshold voltage can be grouped in an "active region" of the diffusion region. Transistors in the same active region may be formed with minimum spacing according to the semiconductor fabrication process and thus may achieve high density. That is, there may not be an additional isolation needed between transistors other than following the minimum spacing rules. On the other hand, when active regions of different transistor types abut each other within a diffusion region, a diffusion break isolation may be inserted between them. Thus, a pair of active regions may logically abut each other if there are no other active regions between the two regions, even though a diffusion break isolation may have been inserted.

For example, a first active region in each diffusion region 12 in FIG. 1 may be defined to the left of the dotted line 10 in FIG. 1. Transistors in this active region have a threshold voltage VTA. Various gates such as the gate 16 may be constructed in the active region to form the transistors in the active region. Another active region in each diffusion region 12 may defined to the right of the dotted line 14 in FIG. 1. Transistors in this active region may have a threshold voltage VTC. VTC is different from VTA (e.g. VTC may be higher or lower than VTA). The area between the active regions between the dotted lines 10 and 14) is the diffusion break isolation.

A diffusion break isolation includes one or more transistors having a "dummy" gate structure. The dummy gate may be coupled to a fixed voltage source, such as a power supply voltage, so that the transistor formed by the dummy gate is ensured to be off during operation. Accordingly, a dummy gate for an N region may be coupled to Vss (or "ground"), because N transistors need a positive gate to source voltage to turn on. A dummy gate for a P region may be coupled to Vdd, since a negative gate to source voltage is used to turn on P transistors. Since the dummy transistors in the diffusion break are off, they create electrical insulation/isolation between the active regions. That is, current flow between the regions is substantially prevented/minimized by the diffusion break isolation.

In FIG. 1, a single diffusion break is used between the active regions, formed by dummy gate structures 22 and 24 for the N region and P region, respectively. That is, a single gate structure is used in the single diffusion break, minimizing the space occupied by the diffusion break and thus permitting higher usable gate density. The threshold voltage of the transistors in the single diffusion break is VTB, which is different from VTA and VTC. Particularly, VTB may be greater than both VTA and VTC. While the transistors are inactive during operation (providing electrical isolation between the active regions), having a higher threshold voltage also reduces the leakage current. The lower leakage current lessens the power consumption in the single diffusion break, which may improve power efficiency. Thus, the leakage current in each of the transistors formed by the dummy gates 22 and 24 is lower than the leakage current in a given transistor in the active regions (e.g. lower than a given transistor in the active regions to the left of the dotted line 10, having the threshold voltage VTA, and lower than a given transistor in the active region to the right of the dotted line 14, having the threshold voltage VTC).

It is noted that, while the gates in the active regions (e.g. gate 16) are shown as covering both the P and N portions of the active regions, the gates may be divided to form independent P and N transistors, similar to the gates 22 and 24 in the diffusion break isolation structure.

Figure 2:
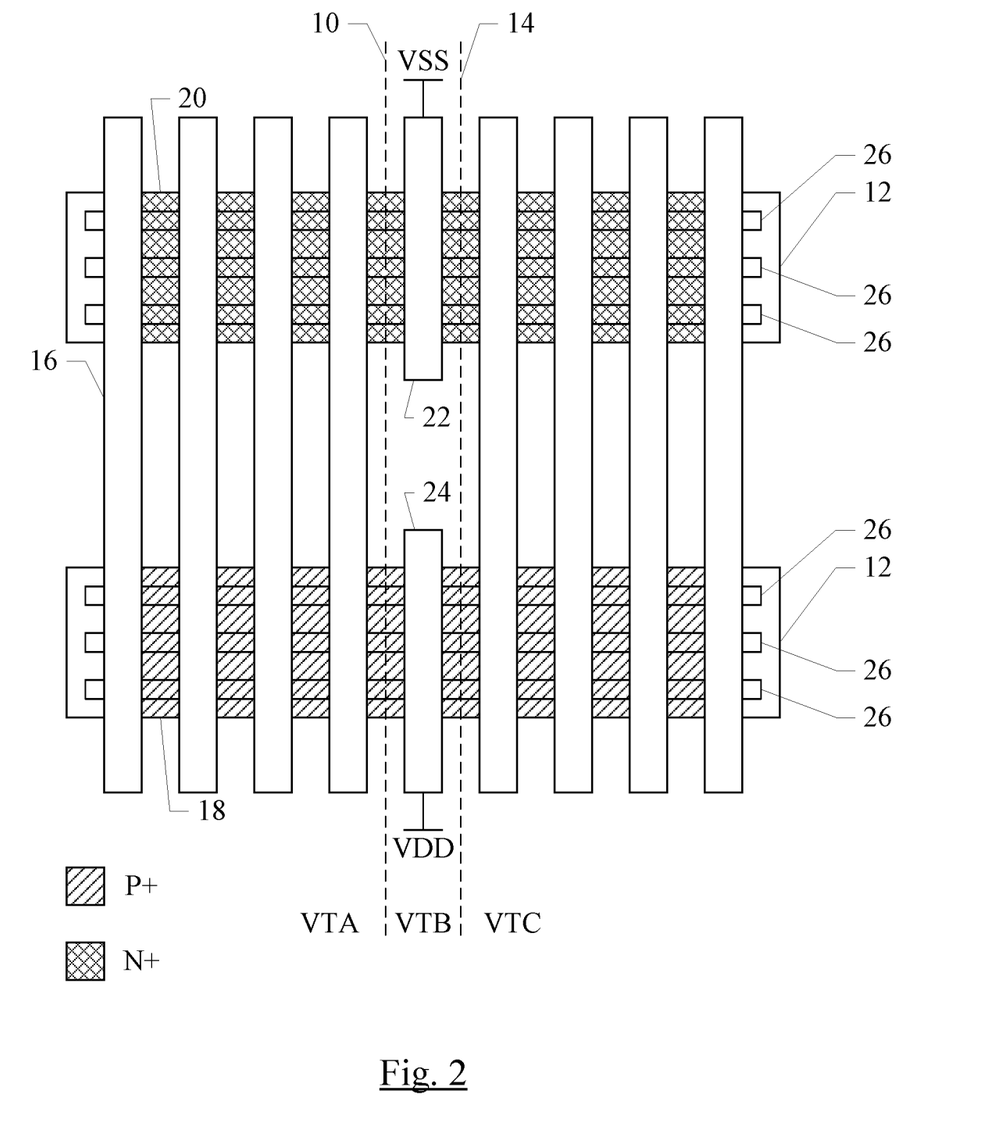
FIG. 2 is a block diagram of one embodiment of the set of transistors shown in FIG. 1 in a FinFET process.

FIG. 1 illustrates generically any type of semiconductor substrate. In an embodiment, the single diffusion breaks with higher threshold voltage transistors than the active regions they isolate may be employed in a fin field effect transistor (FinFET) process. FIG. 2 is a block diagram illustrating the embodiment of FIG. 1 with the fins of a FinFET processor. In FIG. 2, the diffusion regions 12 may include multiple "fins" 26. The fins 26 in the semiconductor regions 12 may rise above the surface of the substrate. The fins 26 in each region 12 may be parallel to each other and parallel to the fins 26 in other regions 12. The fins 26 may actually be separated by insulators such as STI, and so the actual N+ and P+ regions may be in the fins 14 themselves. Depending on the FinFET fabrication process, the fins may be further grown into other shapes such as diamond or merged together through a semiconductor epitaxial process step.

When using the single diffusion break isolation as described above, various shapes used to form masks for the semiconductor fabrication process may experience point touch violations. For example, various masks may be used to pattern the surface of the semiconductor substrate to build the gate structure stacks mentioned above. The masks may, for example, expose the active regions that are to receive a given layer of material forming the gate stack and to prevent the exposure of active regions that are not to receive the material. The masks may be used for photolithography to selectively harden a photo resist in areas that are not to be exposed, prior to the application of the material. The unhardened photo resist may be removed, and the material may be applied. The hardened photo resist may then be removed (along with any of the material atop the hardened photo resist) after the material is applied. In this manner, the material is selectively included in gate stacks as desired.

Figure 3:
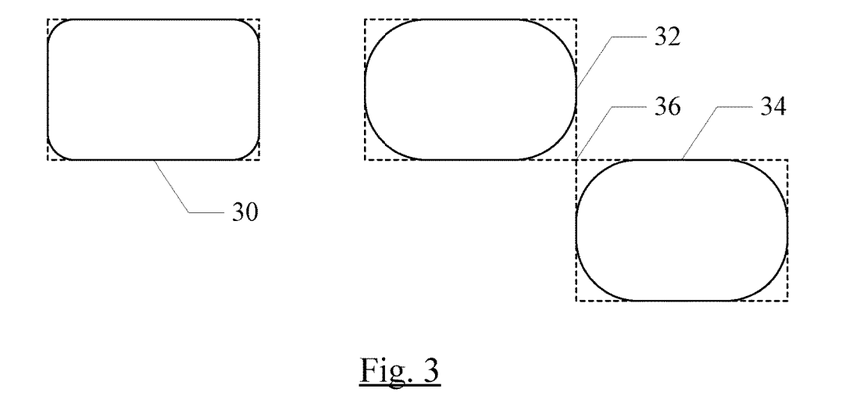
FIG. 3 is a block diagram illustrating shape rounding and exacerbation of shape rounding due to a touch point, for an embodiment.

The mask shapes to either side of the single diffusion breaks can experience point touch violations as they touch at a corner of the shapes. FIG. 3 is a block diagram illustrating the point touch violation. In general, mask shapes drawn by various electronic design automation (EDA) tools become slightly rounded. On the left in FIG. 3, a rectangular shape 30 is shown (dotted lines) along with the resulting slightly rounded shape within the rectangle (solid line). On the right in FIG. 3, two rectangular shapes 32 and 34 that touch at a corner 36 are shown. To meet various minimum spacing requirements in the semiconductor fabrication process, the resulting shapes are even more rounded.

Figure 4:
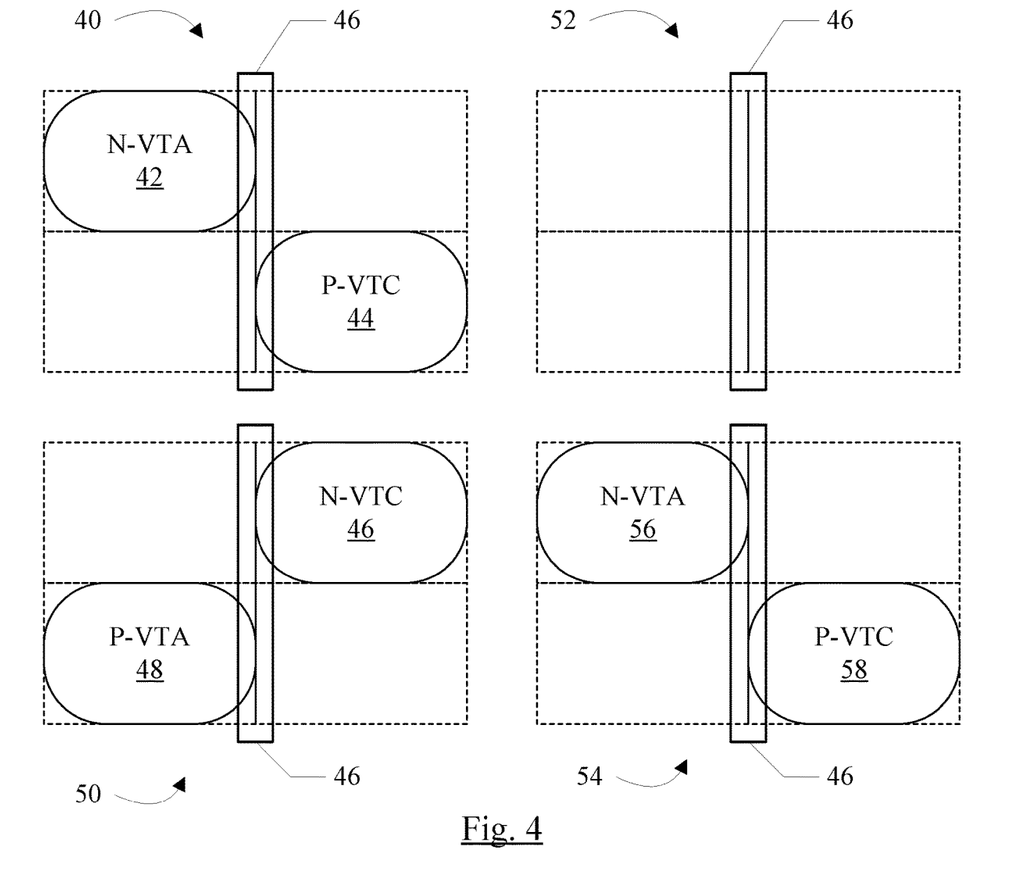
FIG. 4 is a block diagram illustrating shapes drawn for various threshold voltage (VT) groups, in an embodiment, including examples of touch points.

FIG. 4 is a block diagram illustrating point touch violations in masks for various processing steps in the formation of gate structures for the integrated circuit, for an embodiment. The example of FIG. 4 may apply to the embodiment of the semiconductor substrate shown in FIGS. 1 and 2, for example, with active regions having threshold voltages VTA and VTC and the single diffusion break transistors having threshold voltage VTB.

In this embodiment, various VT groups may be defined based on which materials are included in each gate stack. For example, at each step another material that may be selectively included in a gate stack to set the threshold of the transistors may be applied. If a transistor of a given conduction type and desired threshold voltage includes that material (or includes that material at that point in the gate stack, if the same material is applied more than once), then an active region including those transistors participates in the application of that material. If the transistor does not include the material, it is masked from the application of that material. Thus, transistors of different threshold voltages may be part of a VT group if those transistors both receive the material to be deposited at the step corresponding to that VT group, and are not part of the VT group if they do not receive the material to be deposited.

Four VT groups are illustrated in FIG. 4. In the first VT group 40, the N-type transistors having threshold voltage VTA and the P-type transistors having the threshold voltage VTC require mask shapes (e.g. they do not receive the material being deposited at the step represented by the first VT group 40). The mask shapes are shown in FIG. 4 as reference numerals 42 and 44, respectively. These two shapes have a point touch and thus become rounded as shown in FIG. 3. The rounded portions in particular affect the area that includes the dummy gate structures, shown as a heavy-lined rectangle 46. Similarly, in a second VT group 50, the N-type transistors having threshold voltage VTC and the P-type transistors having threshold voltage VTA require mask shapes (reference numerals 46 and 50 respectively) and experience a point touch violation. In a third VT group 52, no mask shapes are needed, and in a fourth VT group 54 the N-type transistors of threshold voltage VTA and the P-type transistors of the threshold voltage VTC (reference numerals 56 and 58, respectively) and they experience a point touch violation.

Because the area 46 where the point touch violations occur corresponds to the dummy gate structure in the single diffusion break isolation, for which a high threshold voltage is desired, the point touch violations may be resolved by moving the shapes away from each other, exposing the area 46 to each VT group. Alternatively, if the dummy gate structure is not to receive the material applied in a given VT group, the point touch violation may be resolved by moving the shapes toward each other, creating an area of overlap (when viewed vertically in FIGS. 4 and 5) and covering the dummy gate structure. The materials included in the dummy gate may be a superset of the materials included in the gate structures of the VTA and VTC transistors, in an embodiment. Viewed in another way, the materials in the gate structures in the VTA transistors may be a subset of the materials in the gate structure of the dummy gate transistors. Similarly, the materials in the gate structures of the VTC transistors may be a subset of the materials forming the gate structure of the dummy gate transistors.

Figure 5:
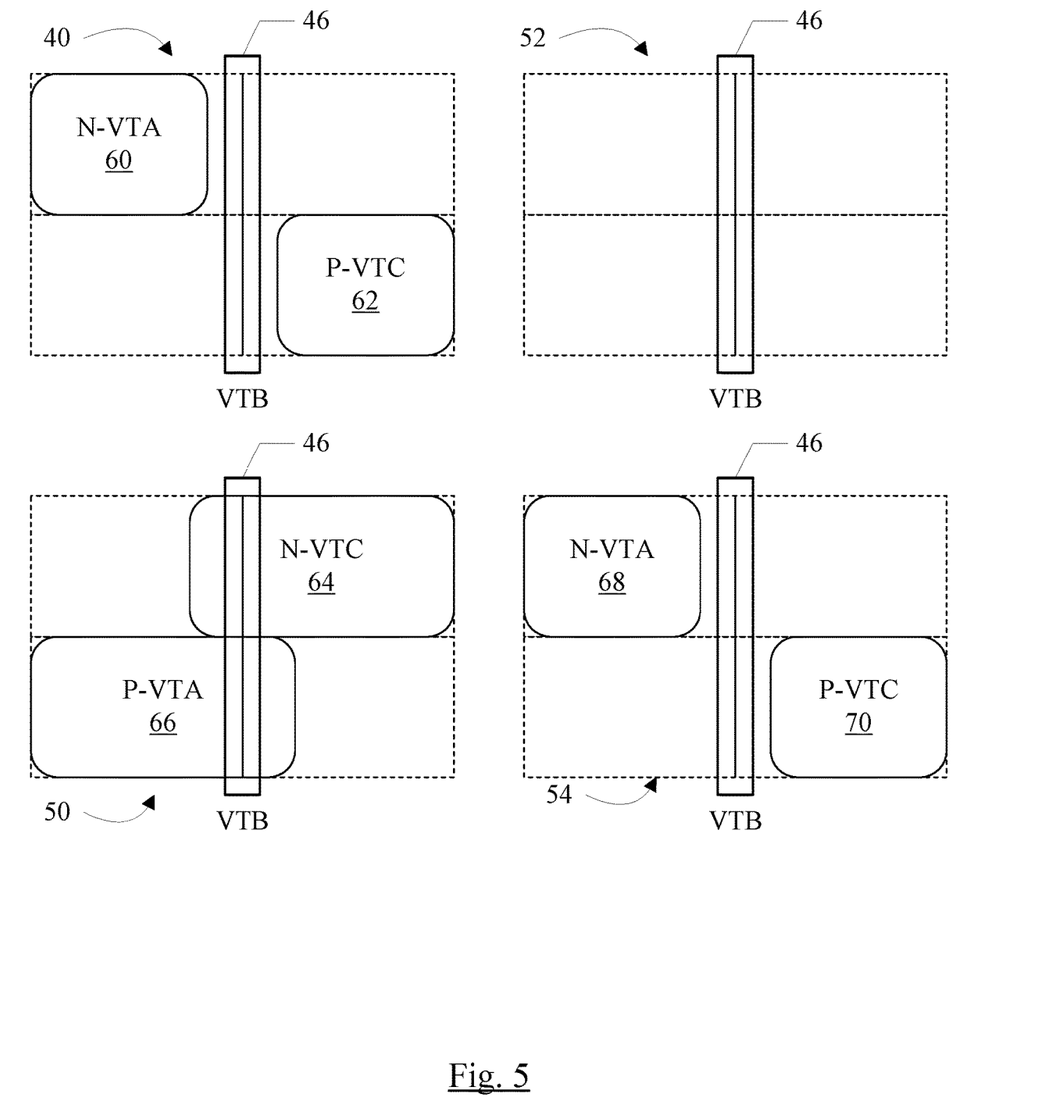
FIG. 5 is a block diagram illustrating adjusted shapes for various VT groups, in an embodiment.

FIG. 5 illustrates the VT groups 40, 50, 52, and 54 with the shapes adjusted. In the VT groups 40 and 54, the shapes have been adjusted by moving them away from the area 46. In the VT group 50, the shapes have been adjusted by moving them toward (and overlapping) the area 46. The point touch violations are resolved, and thus more regular shapes appear (reference numerals 60, 62, 64, 66, 68 and 70 corresponding to reference numerals 42, 44, 46, 48, 56, and 58, respectively). Additionally, the area 46 is included or excluded appropriately in each VT group 40, 50, 52, and 54 to create the desired threshold voltage VTB.

While 4 VT groups are illustrated in FIGS. 4 and 5, generally any number of VT groups may be used in various embodiments. The number of VT groups may vary based on the number of layers of materials that may be included in a gate stack, the number of supported variations in the materials for a gate stack to create transistors of the various threshold voltages, etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a first active region within a first diffusion region of a first conductivity type, wherein the first active region includes a plurality of first transistors having a first threshold voltage, wherein a first transistor of the plurality of first transistors has a first gate formed from a first plurality of layers of materials, and wherein the first threshold voltage is dependent on the materials in the first plurality of layers of materials and the order of the first plurality of layers;
a second active region within the first diffusion region, wherein the second active region includes a plurality of second transistors having a second threshold voltage different than the first threshold voltage, wherein a second transistor of the plurality of second transistors has a second gate formed from a second plurality of layers of materials, wherein the second threshold voltage is dependent on the materials in the second plurality of layers of materials and the order of the second plurality of layers; and
a single diffusion break isolation between the first active region and the second active region, wherein the single diffusion break isolation includes a single transistor having a third threshold voltage greater than the first threshold voltage and the second threshold voltage, wherein the single transistor has a single gate formed from a third plurality of layers of materials, wherein the third threshold voltage is dependent on the third plurality of layers of materials and the order of the third plurality of layers, wherein there is at least one difference between the first plurality of layers of materials and the second plurality of layers of materials, wherein there is at least one difference between the first plurality of layers of materials and the third plurality of layers of materials, and wherein there is at least one difference between the third plurality of layers of materials and the second plurality of layers of materials.

2. The integrated circuit as recited in claim 1 wherein a leakage current in the single transistor is less than a leakage current in the first transistor, and wherein the leakage current in the single transistor is less than a leakage current in the second transistor.

3. The integrated circuit as recited in claim 1 wherein the single gate is coupled to a fixed voltage input during operation that ensures that the single transistor is off during operation.

4. The integrated circuit as recited in claim 3 further comprising:
a third active region within a second diffusion region, wherein the second diffusion region has a second conductivity type different from the first conductivity type, wherein the third active region includes a plurality of third transistors having a fourth threshold voltage, wherein a third transistor of the plurality of third transistors has a third gate formed from a fourth plurality of layers of materials, and wherein the fourth threshold voltage is dependent on the materials in the fourth plurality of layers of materials and the order of the fourth plurality of layers;
a fourth active region within the second diffusion region, wherein the fourth active region includes a plurality of fourth transistors having a fifth threshold voltage different than the fourth threshold voltage, wherein a fourth transistor of the plurality of fourth transistors has a fourth gate formed from a fifth plurality of layers of materials, wherein the fifth threshold voltage is dependent on the materials in the fifth plurality of layers of materials and the order of the fifth plurality of layers; and
a second single diffusion break isolation between the third active region and the fourth active region within the second diffusion region, wherein the second single diffusion break isolation includes a second single transistor having a second single gate formed from a sixth plurality of layers of materials and aligned to the single gate of the single transistor, wherein the second single transistor has a sixth threshold voltage greater than the fourth threshold voltage and the fifth threshold voltage, wherein the sixth threshold voltage is dependent on the materials in the sixth plurality of layers of materials and the order of the sixth plurality of layers, and wherein there is at least one difference between the fourth plurality of layers of materials and the fifth plurality of layers of materials, wherein there is at least one difference between the fourth plurality of layers of materials and the sixth plurality of layers of materials, and wherein there is at least one difference between the fifth plurality of layers of materials and the sixth plurality of layers of materials.

5. The integrated circuit as recited in claim 4 wherein the second single gate is coupled to a second fixed voltage input during operation that ensures that the second single transistor is off during operation, wherein the second fixed voltage input is different than the fixed voltage input.

6. The integrated circuit as recited in claim 1 wherein the plurality of first transistors, the plurality of second transistors, and the single transistor are fin field effect transistors (FinFETs).

7. An integrated circuit comprising:
a first diffusion region of a first conductivity type, wherein the first diffusion region comprises:
a plurality of first transistors having a first threshold voltage, wherein a first plurality of layers of materials forming gates of the plurality of first transistors are a factor in the first threshold voltage;
a plurality of second transistors having a second threshold voltage different than the first threshold voltage, wherein a second plurality of layers of materials forming gates of the plurality of second transistors are a factor in the second threshold voltage; and
a single diffusion break isolation between the first plurality of transistors and the second plurality of transistors, wherein the single diffusion break isolation includes a single transistor having a single gate, wherein the single transistor has a third threshold voltage that is greater than the first threshold voltage and the second threshold voltage, and wherein a third plurality of layers of materials forming the single gate are a factor in the third threshold voltage, and wherein there is at least one difference between the third plurality of layers of materials and the first plurality of layers of materials, and wherein there is at least one difference between the third plurality of layers of materials and the second plurality of layers of materials.

8. The integrated circuit as recited in claim 7 wherein there is at least one difference between the first plurality of layers of materials and the second plurality of layers of materials.

9. The integrated circuit as recited in claim 7 wherein the difference is at least one of an order of the third plurality of layers of materials and a type of material in a given layer of the third plurality of layers of materials.

10. The integrated circuit are cited in claim 7 wherein the first plurality of layers of materials are a dominant factor in the first threshold voltage.

11. The integrated circuit as recited in claim 7 wherein the first plurality of layers of materials are a primary factor in the first threshold voltage.

12. The integrated circuit as recited in claim 7 further comprising:
a second diffusion region of a second conductivity type different than the first conductivity type, wherein the second diffusion region comprises:
a plurality of third transistors having a fourth threshold voltage, wherein a fourth plurality of layers of materials forming gates of the plurality of third transistors are a factor in the fourth threshold voltage;
a plurality of fourth transistors having a fifth threshold voltage different than the fourth threshold voltage, wherein a fifth plurality of layers of materials forming gates of the plurality of fourth transistors are a factor in the fifth threshold voltage; and
a second single diffusion break isolation between the third plurality of transistors and the fourth plurality of transistors, wherein the second single diffusion break isolation includes a second single transistor having a second single gate, wherein the second single transistor has a sixth threshold voltage that is greater than the fourth threshold voltage and the fifth threshold voltage, and wherein a sixth plurality of layers of materials forming the second single gate are a factor in the sixth threshold voltage, and wherein there is at least one difference between the sixth plurality of layers of materials and the fourth plurality of layers of materials, and wherein there is at least one difference between the sixth plurality of layers of materials and the fifth plurality of layers of materials.

13. The integrated circuit as recited in claim 12 wherein the second single gate is coupled to a fixed voltage input during operation that ensures that the second single transistor is off during operation.

14. The integrated circuit as recited in claim 13 wherein the single gate is coupled to a second fixed voltage input during operation that ensures that the single transistor is off during operation.

15. An integrated circuit comprising:
a first active region within a first diffusion region of a first conductivity type, wherein the first active region includes a plurality of first transistors having a first threshold voltage, wherein a first transistor of the plurality of first transistors has a first gate formed from a first plurality of layers of materials, and the materials in the first plurality of layers of materials and the order of the first plurality of layers primarily control the first threshold voltage;
a second active region within the first diffusion region, wherein the second active region includes a plurality of second transistors having a second threshold voltage different than the first threshold voltage, wherein a second transistor of the plurality of second transistors has a second gate formed from a second plurality of layers of materials, wherein the materials in the second plurality of layers of materials and the order of the second plurality of layers primarily control the second threshold voltage; and
a single diffusion break isolation between the first active region and the second active region, wherein the single diffusion break isolation includes a single transistor having a third threshold voltage greater than the first threshold voltage and the second threshold voltage, wherein the single transistor has a single gate formed from a third plurality of layers of materials, wherein the third plurality of layers of materials and the order of the third plurality of layers primarily control the third threshold voltage, wherein there is at least one difference between the first plurality of layers of materials and the second plurality of layers of materials, wherein there is at least one difference between the first plurality of layers of materials and the third plurality of layers of materials, and wherein there is at least one difference between the third plurality of layers of materials and the second plurality of layers of materials.

16. The integrated circuit as recited in claim 15 wherein a leakage current in the single transistor is less than a leakage current in the first transistor, and wherein the leakage current in the single transistor is less than a leakage current in the second transistor.

17. The integrated circuit as recited in claim 15 wherein the single gate is coupled to a fixed voltage input during operation that ensures that the single transistor is off during operation.

18. The integrated circuit as recited in claim 17 further comprising:
a third active region within a second diffusion region, wherein the second diffusion region has a second conductivity type different from the first conductivity type, wherein the third active region includes a plurality of third transistors having a fourth threshold voltage, wherein a third transistor of the plurality of third transistors has a third gate formed from a fourth plurality of layers of materials, and wherein the materials in the fourth plurality of layers of materials and the order of the fourth plurality of layers primarily control the fourth threshold voltage;
a fourth active region within the second diffusion region, wherein the fourth active region includes a plurality of fourth transistors having a fifth threshold voltage different than the fourth threshold voltage, wherein a fourth transistor of the plurality of fourth transistors has a fourth gate formed from a fifth plurality of layers of materials, wherein the materials in the fifth plurality of layers of materials and the order of the fifth plurality of layers primarily control the fifth threshold voltage; and
a second single diffusion break isolation between the third active region and the fourth active region within the second diffusion region, wherein the second single diffusion break isolation includes a second single transistor having a second single gate formed from a sixth plurality of layers of materials and aligned to the single gate of the single transistor, wherein the second single transistor has a sixth threshold voltage greater than the fourth threshold voltage and the fifth threshold voltage, wherein the materials in the sixth plurality of layers of materials and the order of the sixth plurality of layers primarily control the sixth threshold voltage, wherein there is at least one difference between the fourth plurality of layers of materials and the fifth plurality of layers of materials, wherein there is at least one difference between the fourth plurality of layers of materials and the sixth plurality of layers of materials, and wherein there is at least one difference between the fifth plurality of layers of materials and the sixth plurality of layers of materials.

19. The integrated circuit as recited in claim 18 wherein the second single gate is coupled to a second fixed voltage input during operation that ensures that the second single transistor is off during operation.

20. The integrated circuit as recited in claim 15 wherein the plurality of first transistors, the plurality of second transistors, and the single transistor are fin field effect transistors (FinFETs).

* * * * *